United States Patent
Shim et al.

(10) Patent No.: US 10,093,534 B2
(45) Date of Patent: Oct. 9, 2018

(54) CAPACITIVE MICROMACHINED ULTRASONIC TRANSDUCER AND METHOD OF FABRICATING THE SAME

(71) Applicant: SAMSUNG ELECTRONICS CO., LTD., Suwon-si (KR)

(72) Inventors: Dong-sik Shim, Hwaseong-si (KR); Seog-woo Hong, Yongin-si (KR); Seok-whan Chung, Hwaseong-si (KR); Chang-jung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/922,972

(22) Filed: Mar. 16, 2018

(65) Prior Publication Data

US 2018/0201501 A1    Jul. 19, 2018

Related U.S. Application Data

(62) Division of application No. 14/286,460, filed on May 23, 2014, now Pat. No. 9,957,155.

(30) Foreign Application Priority Data

Nov. 20, 2013    (KR) .................... 10-2013-0141587

(51) Int. Cl.
*B81B 7/00* (2006.01)
*B06B 1/02* (2006.01)
*B81C 1/00* (2006.01)

(52) U.S. Cl.
CPC ............ *B81B 7/007* (2013.01); *B06B 1/0292* (2013.01); *B81C 1/00301* (2013.01)

(58) Field of Classification Search
CPC .... B81B 7/007; B81B 1/0292; B81B 1/00301
(Continued)

(56) References Cited

U.S. PATENT DOCUMENTS 7,612,483 B2 * 11/2009 Degertekin ........... B06B 1/0292
                                                          310/309
7,875,484 B2 *  1/2011 Yeh ..................... B81C 1/00246
                                                          257/415

(Continued)

FOREIGN PATENT DOCUMENTS

| JP | 4271252 B2 | 6/2009 |
| JP | 4839099 B2 | 12/2011 |
| JP | 4839176 B2 | 12/2011 |

*Primary Examiner* — Bo Fan
(74) *Attorney, Agent, or Firm* — Sughrue Mion, PLLC (57) ABSTRACT

A capacitive micromachined ultrasonic transducer and a method of fabricating the same are provided. The capacitive micromachined ultrasonic transducer includes a device substrate including a first trench defining a plurality of first portions corresponding to an element and a second trench spaced apart from the first trench; a supporting unit provided on the device substrate, the supporting unit defining a plurality of cavities; a membrane provided on the supporting unit to cover the plurality of cavities; a top electrode electrically connected to a second portion in the second trench through a via hole penetrating through the membrane and the supporting unit; and a through silicon via (TSV) substrate provided on a bottom surface of the device substrate, the TSV substrate including a first via metal connected to the plurality of first portions corresponding to the element and a second via metal connected to the second portion.

8 Claims, 9 Drawing Sheets

(58) Field of Classification Search
USPC ........... 257/415, 416; 29/417; 310/300, 309;
438/16, 48, 706; 367/181; 600/457
See application file for complete search history.

(56) References Cited

U.S. PATENT DOCUMENTS

| | | | |
|---|---|---|---|
| 8,324,006 | B1 | 12/2012 | Adler et al. |
| 8,402,831 | B2 * | 3/2013 | Kupnik ................ B06B 1/0292 310/300 |
| 8,429,808 | B2 * | 4/2013 | Huang ................ B06B 1/0292 29/417 |
| 2005/0177045 | A1 | 8/2005 | Degertekin et al. |
| 2009/0122651 | A1 | 5/2009 | Kupnik |
| 2009/0140609 | A1 | 6/2009 | Huang |
| 2010/0201222 | A1 | 8/2010 | Adachi |
| 2011/0073968 | A1 | 3/2011 | Ezaki |

\* cited by examiner

FIG. 4I

CAPACITIVE MICROMACHINED ULTRASONIC TRANSDUCER AND METHOD OF FABRICATING THE SAME

CROSS-REFERENCE TO RELATED APPLICATIONS

This application is a continuation application of U.S. patent application Ser. No. 14/286,460, filed May 23, 2014, which claims the benefit of Korean Patent Application No. 10-2013-0141587, filed on Nov. 20, 2013, in the Korean Intellectual Property Office, the disclosures of which are incorporated herein in their entirety by reference.

BACKGROUND

1. Field

The exemplary embodiments relate to capacitive micromachined ultrasonic transducers using a plurality of conductive material layers defined by trenches as bottom electrodes and methods of fabricating the same.

2. Description of the Related Art

A micromachined ultrasonic transducer (MUT) is a device capable of converting electric signals into ultrasonic signals or converting ultrasonic signals into electric signals. Such MUTs may be categorized into piezoelectric micromachined ultrasonic transducers (PMUT), capacitive micromachined ultrasonic transducers (CMUT), and magnetic micromachined ultrasonic transducers (MMUT) according to a conversion mechanism.

A conventional CMUT supplies electricity to a top electrode by using a through via formed in a low-resistance wafer. During formation of the through via, a corner of a through via hole may not be completely coated by a passivation layer, and a metal layer for the through via may contact the low-resistance wafer, and thus, the through via and the low-resistance wafer may be short-circuited. Furthermore, a masking process for forming the through via is required.

SUMMARY

Exemplary embodiments may provide capacitive micromachined ultrasonic transducers which employ low-resistance wafers for supplying currents to top electrodes without through vias.

Exemplary embodiments may provide methods of fabricating the capacitive micromachined ultrasonic transducers.

Additional aspects will be set forth in part in the description which follows and, in part, will be apparent from the description, or may be learned by practice of the presented exemplary embodiments.

According to an aspect of an exemplary embodiment, there is provided a capacitive micromachined ultrasonic transducer (CMUT) including a first trench defining a plurality of first portions corresponding to an element, and a second trench spaced apart from the first trench; a supporting unit provided on the device substrate, the supporting unit defining a plurality of cavities; a membrane provided on the supporting unit to cover the plurality of cavities; a top electrode electrically connected to a second portion in the second trench through a via hole penetrating through the membrane and the supporting unit; and a through silicon via (TSV) substrate provided on a bottom surface of the device substrate, the TSV substrate including a first via metal connected to the plurality of first portions corresponding to the element and a second via metal connected to the second portion.

The first trench has a lattice-like shape.

The device substrate includes a low-resistance silicon.

A thickness of the device substrate is from about 10 μm to about 50 μm.

The first trench and the second trench have a same width.

The width of the first trench and the second trench is from about 1 μm to about 10 μm.

The first trench and the second trench are filled with an insulating material.

The CMUT further includes a first bonding metal provided between the plurality of first portions corresponding to the element and the first via metal; and a second bonding metal provided between the second portion and the second via metal.

The first bonding metal contacts the plurality of first portions formed below the plurality of cavities of the element.

The CMUT further includes an insulation layer, which is provided between the device substrate and the supporting unit and is penetrated by the via hole, such that the second portion and the top electrode contact each other.

The CMUT further includes an insulation layer, which is provided between the membrane and the supporting unit and is penetrated by the via hole, such that the second portion and the top electrode contact each other.

According to another aspect of an exemplary embodiment, there is provided a method of fabricating a capacitive micromachined ultrasonic transducer (CMUT), the method including forming a first trench insulating a plurality of first portions corresponding to an element and a second trench defining a second portion spaced apart from the plurality of first portions, the first trench and the second trench being formed to a predetermined depth from a top surface of a device substrate; forming a supporting unit including an insulation layer defining a plurality of cavities on the top surface of the device substrate or on a first silicon layer of a silicon-on-insulator (SOI) substrate; forming the plurality of cavities between the SOI substrate and the device substrate by bonding the SOI substrate to the top surface of the device substrate; exposing the first trench and the second trench by thinning a bottom surface of the device substrate; bonding a through silicon via (TSV) substrate to the bottom surface of the device substrate, the TSV substrate including a first via metal connected to the plurality of first portions and a second via metal connected to the second portion; exposing the first silicon layer on the supporting unit by removing a buried oxide layer and a second silicon layer of the SOI substrate; exposing the second portion by forming a via hole penetrating through the first silicon layer and the supporting unit; and forming a top electrode on the first silicon layer to contact the second portion through the via hole.

The device substrate is bonded to the SOI substrate by a silicon direct bonding (SDB) method.

In the forming of the first trench and the second trench, the first trench and the second trench have a same width.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It will be understood that when a layer, region, or component is referred to as being "formed on" another layer, region, or component, it can be directly or indirectly formed on the other layer, region, or component. That is, for example, intervening layers, regions, or components may be present. Like reference numerals refer to like elements throughout, and detailed descriptions thereof will be omitted. As used herein, the term "and/or" includes any and all combinations of one or more of the associated listed items.

Figure 1:
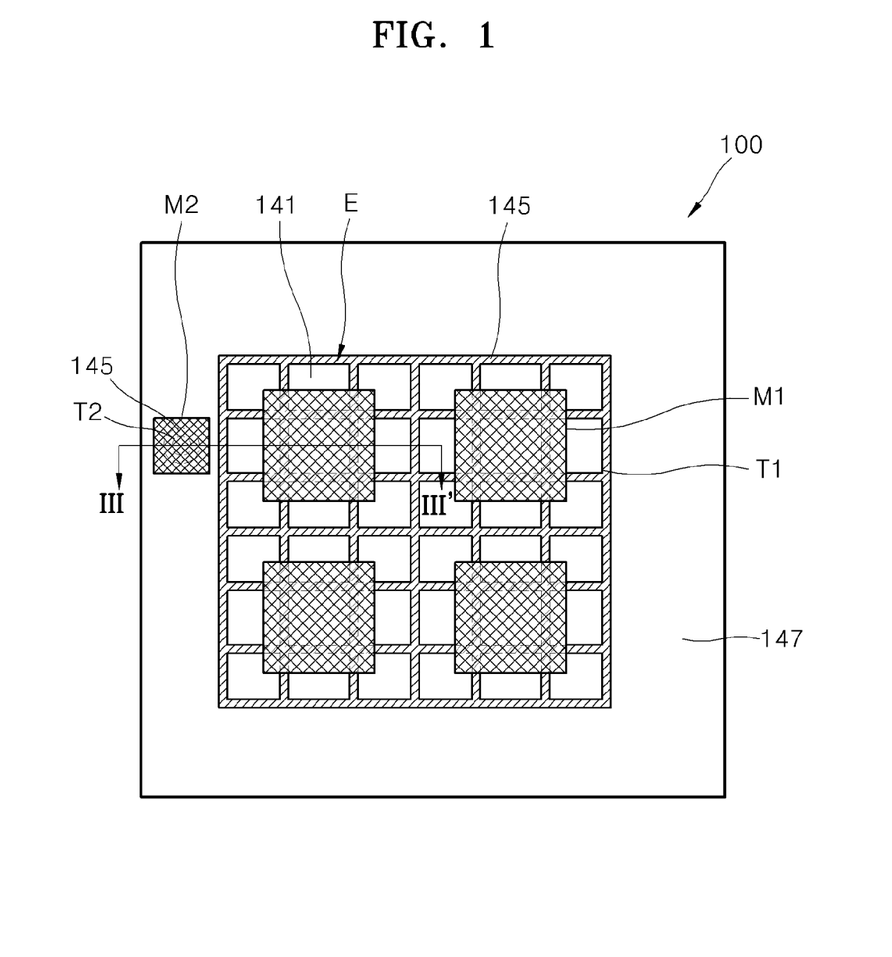
FIG. 1 is a schematic bottom view of a capacitive micromachined ultrasonic transducer (CMUT) according to exemplary embodiments.

FIG. 1 is a schematic bottom view of a capacitive micromachined ultrasonic transducer (CMUT) 100 according to exemplary embodiments.

FIG. 1 is a bottom view of a device substrate. Referring to FIG. 1, a CMUT 100 includes a plurality of elements E. For example, the CMUT 100 may include the elements E arranged in a 16×16 matrix. In FIG. 1, four elements E are shown for convenience of explanation. The CMUT 100 may also be referred to as an ultrasonic transducer chip.

A first trench T1, which is an insulating trench, is formed at each element E. The first trench T1 may be formed in a shape of a lattice. A plurality of first portions 141 are formed at each of the elements E by the first trench T1. A first bonding metal M1 is formed to contact the plurality of first portions 141 in the element E.

A second trench T2 is formed next to the elements E. A second bonding metal M2 is formed to contact a second portion (142 of FIG. 3) surrounded by the second trench T2. The reference numeral 145 denotes an insulating material filling the first trench T1 and the second trench T2.

Figure 2:
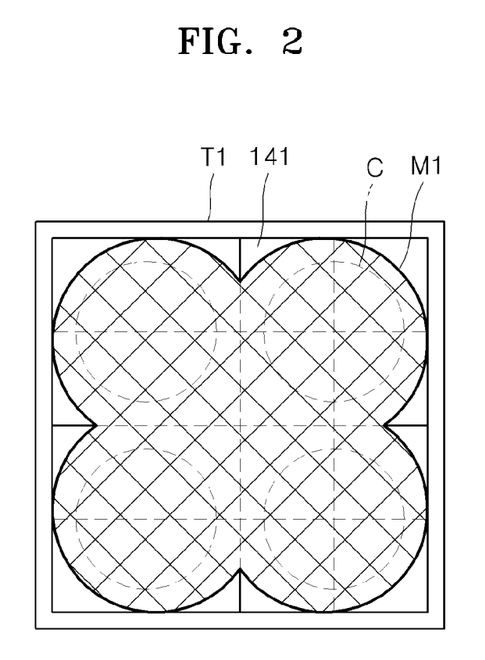
FIG. 2 is a schematic bottom view showing the structure of one element region of a CMUT according to exemplary embodiments.

FIG. 2 is a schematic bottom view showing the structure of one element region of a CMUT according to exemplary embodiments.

Referring to FIG. 2, a plurality of cavities C is formed at the element E. In FIG. 2, the four cavities C are shown for convenience of explanation. The first bonding metal M1 is formed to be electrically connected to first portions 141 below the cavities C. Although FIG. 1 shows that the first bonding metal M1 has a rectangular shape, the exemplary embodiments are not limited thereto. For example, in FIG. 2, the first bonding metal M1 may be formed to have a rounded shape to contact the first portions 141 below the cavities C. Furthermore, the first trench T1 may not be formed at the plurality of first portions 141 formed below the cavities C.

Figure 3:
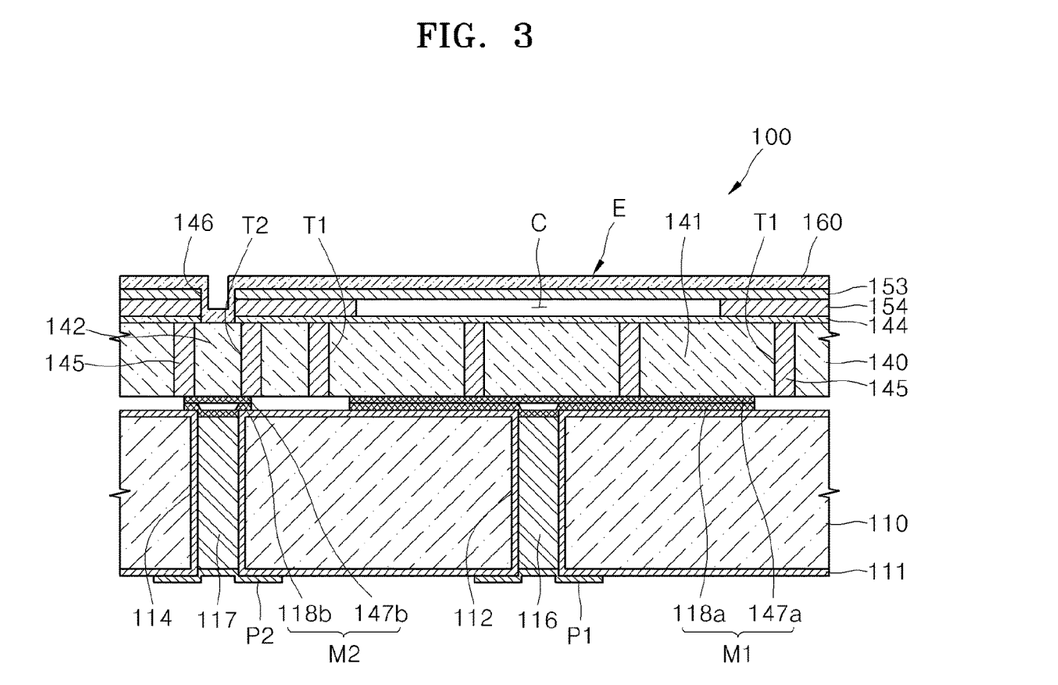
FIG. 3 is a sectional view taken along a line III-III' of FIG. 1.

FIG. 3 is a sectional view taken along a line III-III' of FIG. 1.

Referring to FIG. 3, the CMUT 100 may include a through silicon via (TSV) substrate 110 and a device substrate 140 bonded to the TSV substrate 110. The TSV substrate 110 and the device substrate 140 may be bonded to each other via eutectic bonding.

The TSV substrate 110 is formed of a silicon substrate, and a plurality of through holes 112 are formed in the TSV substrate 110. In each CMUT 100, the through holes 112 and a through hole 114 for a top electrode are formed to respectively correspond to each element E. An insulation layer 111 is formed on surfaces of the through holes 112, the through hole 114, and the TSV substrate 110. The through holes 112 are filled with a first via metal 116, whereas the through hole 114 is filled with a second via metal 117.

In the device substrate 140, lattice-like first trench T1 is formed at each of the elements E. The second trench T2 for a top electrode is formed to be spaced apart from a region in which the plurality of elements E is formed. The device substrate 140 includes the plurality of first portions 141 surrounded by the first trench T1 and the second portion 142 surrounded by the second trench T2.

The device substrate 140 is formed of a conductive material, where the thickness thereof may be several tens of μm. Thickness of the device substrate 140 may be from about 10 μm to about 50 μm. The device substrate 140 may be formed of a low-resistance silicon highly doped with an impurity.

The first portions 141 and the second portion 142 of the device substrate 140 are conductive regions. The first portions 141 of the device substrate 140 may be used as a bottom electrode.

The first trench T1 and the second trench T2 may be filled with an insulating material 145. The insulating material 145 may be a silicon oxide.

The device substrate 140 may include an insulation layer 144 formed on a top surface of the device substrate 140, a supporting unit 154 forming a cavity C, and a membrane 153 on the supporting unit 154 to cover the cavity C. A top electrode 160 may be formed on the membrane 153. The membrane 153 may be formed of silicon. The supporting unit 154 may be formed of an insulator. The supporting unit 154 may include an oxide, a nitride, etc. For example, the supporting unit 154 may include a silicon oxide.

In FIG. 3, the insulation layer 144 is formed on the top surface of the device substrate 140. However, the exemplary embodiments are not limited thereto. For example, the insulation layer 144 may be formed between the membrane 153 and the supporting unit 154.

The top electrode 160 may be formed of Au, Cu, Sn, Ag, Al, Pt, Ti, Ni, Cr, or an alloy thereof.

The insulation layer 144 may include an oxide, a nitride, etc. For example, the insulation layer 144 may be formed of a silicon nitride.

Although FIG. 3 shows that one cavity C is formed per element E, the exemplary embodiments are not limited thereto. For example, cavities C may be arranged in the shape of a 5×5 array per element E. A first bonding metal M1 may be formed to contact the first portions 141 below the cavity C.

A via hole 146, which penetrates through the membrane 153, the supporting unit 154, and the insulation layer 144 and exposes the second portion 142 of the device substrate 140 surrounded by the second trench T2, is formed in the membrane 153, the supporting unit 154, and the insulation layer 144. The top electrode 160 is electrically connected to the second portion 142 of the device substrate 140 via the via hole 146.

A first bonding pad 147a is formed at the bottom of the device substrate 140 to be connected to the first via metal 116, and a second bonding pad 147b is formed at the bottom of the device substrate 140 to be connected to the second via metal 117. The first bonding pad 147a and the second bonding pad 147b may be formed of eutectic bonding metals. For example, for Au—Sn eutectic bonding, the first bonding pad 147a and the second bonding pad 147b may be formed of an Au-based material and/or a Sn-based material.

A third bonding pad 118a is formed on the first via metal 116 in correspondence to the first bonding pad 147a, whereas a fourth bonding pad 118b is formed on the second via metal 117 in correspondence to the second bonding pad 147b. The third bonding pad 118a and the fourth bonding pad 118b may be formed of eutectic bonding metals. For example, for Au—Sn eutectic bonding, the third bonding pad 118a and the fourth bonding pad 118b may be formed of an Au-based material and/or a Sn-based material. The first bonding pad 147a and the third bonding pad 118a may be eutectically bonded to each other and form the first bonding metal M1, whereas the second bonding pad 147b and the fourth bonding pad 118b may be eutectically bonded to each other and form the second bonding metal M2.

A first electrode pad P1 connected to the first via metal 116 and a second electrode pad P2 connected to the second bonding metal M2 are formed at the bottom of the TSV substrate 110. A ground voltage may be applied to the second electrode pad P2, whereas a driving signal voltage may be applied to the first electrode pad P1.

The driving signal voltage applied to the first electrode pad P1 is supplied to the first portions 141 via the first via metal 116 and the first bonding metal M1.

The ground voltage applied to the first electrode pad P2 is supplied to the top electrode 160 via the second via metal 117, the second bonding metal M2, and the second portion 142.

The CMUT 100 according to exemplary embodiments uses a device substrate as an electrode or an electric path, while the electric path is only formed in a vertical direction due to a trench. Therefore, it is easy to block an electric connection between a top electrode and a bottom electrode in a horizontal direction.

Furthermore, there is no trench defining elements, and gaps between elements are reduced, thereby increasing bandwidth of the CMUT 100.

Hereinafter, a method of fabricating a CMUT according to exemplary embodiments is explained.

FIGS. 4A through 4I are sectional diagrams showing respective operations of a method of fabricating a CMUT according to an exemplary embodiment. FIGS. 4A through 4I are obtained along a line III-III' of FIG. 3.

The elements substantially identical to the elements shown in FIGS. 1 and 3 are denoted by the same reference numerals.

Figure 4A:
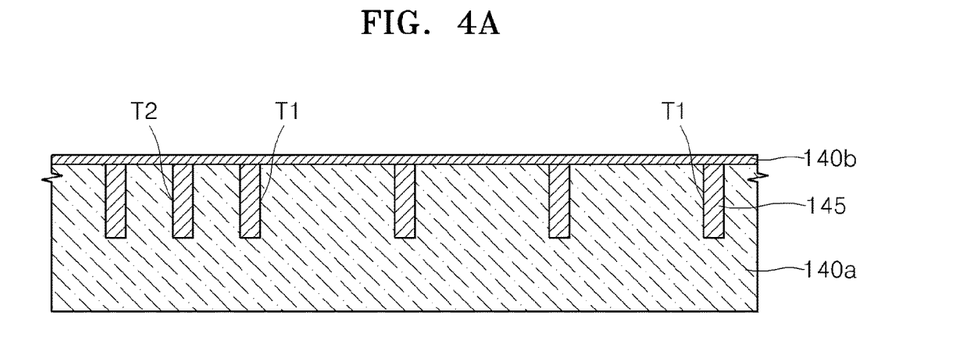
FIGS. 4A through 4I are sectional diagrams showing respective operations of a method of fabricating a CMUT according to exemplary embodiments.

Referring to FIG. 4A, the first trench T1 is formed at an element region from the top surface of a device wafer 140a, and the second trench T2 for a top electrode is formed at a region spaced apart from the element region. The first trench T1 may be formed to have a lattice-like shape with respect to the plurality of elements E of each chip, as shown in FIG. 1. The second trench T2 is formed to surround the second portion 142 interconnecting the device wafer 140a and a top electrode (160 of FIG. 3).

The first trench T1 and the second trench T2 may be formed to have depths from about 10 μm to about 50 μm from the top surface of the device wafer 140a. The first trench T1 and the second trench T2 may have the same width. When the first trench T1 and the second trench T2 have the same width, the first trench T1 and the second trench T2 may be formed together by using a single mask. In the related art, since a width of an element defining a trench is different from a width of a via for connecting a top electrode, etching time for the element defining the trench is different from etching time for the via for connecting a top electrode, and thus the element defining the trench and the via for connecting a top electrode are formed using different etching process. However, according to the present exemplary embodiment, the first trench T1 and the second trench T2 may be simultaneously formed.

The first trench T1 and the second trench T2 may be formed to have a width from about 1 μm to about 10 μm. If the width of the first trench T1 and the second trench T2 is smaller than 1 μm, etching may be difficult due to a high aspect ratio of the trenches T1 and T2. If the width of the first trench T1 and the second trench T2 is greater than 10 μm, frequency characteristics of the CMUT 100 may be deteriorated.

Next, a protection layer covering the first trench T1 and the second trench T2 is formed on the top surface of the device wafer 140a. The protection layer includes the insulating material 145 filling the first trench T1 and the second trench T2 and an insulation layer 140b on the device wafer 140a. The insulating material 145 and the insulation layer 140b may be formed of a silicon oxide. It is not necessary to completely fill the first trench T1 and the second trench T2 with the silicon oxide. The insulation layer 140b may not be uniformly formed.

Figure 4B:
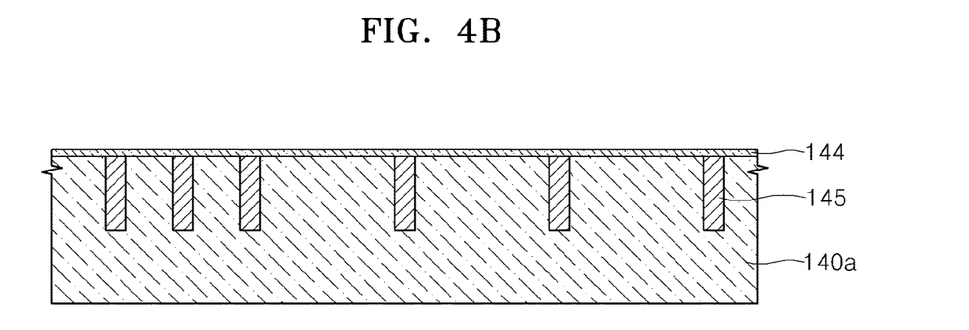

Referring to FIG. 4B, the insulation layer 140b on the device wafer 140a is removed. For example, the first trench T1 and the second trench T2 are exposed by performing a chemical-mechanical polishing (CMP).

Next, a first insulation layer 144 is formed on the top surface of the device wafer 140a. The first insulation layer 144 may be formed by oxidizing the device wafer 140a.

Figure 4C:
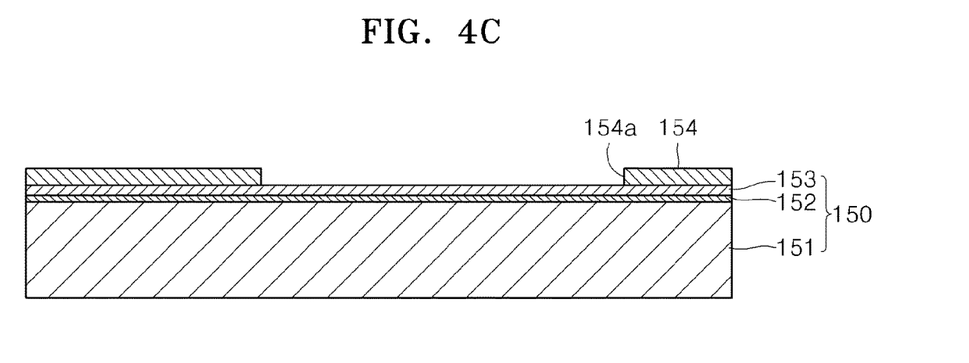

Referring to FIG. 4C, a second insulation layer 154 is formed on a first wafer 150, and an opening 154a is formed by patterning the second insulation layer 154. The first wafer 150 may be a silicon-on-insulator (SOI) wafer. The first wafer 150 may include a first silicon layer 151, a buried oxide layer 152, and a second silicon layer 153 that are stacked in the order stated. The second silicon layer 153 corresponds to the membrane 153 of FIG. 3 and may have a thickness of about 2000 Å.

The second insulation layer 154 may be formed of a silicon oxide and may be formed by oxidizing the first wafer 150. The patterned second insulation layer 154 corresponds to the supporting unit 154 of FIG. 3. A height of the opening 154a may be determined based on thickness of the second insulation layer 154. The thickness of the second insulation layer 154 may be about 4000 Å.

The opening 154a may be formed in the first insulation layer 144 instead of the second insulation layer 154. Detailed descriptions thereof will be omitted.

Figure 4D:
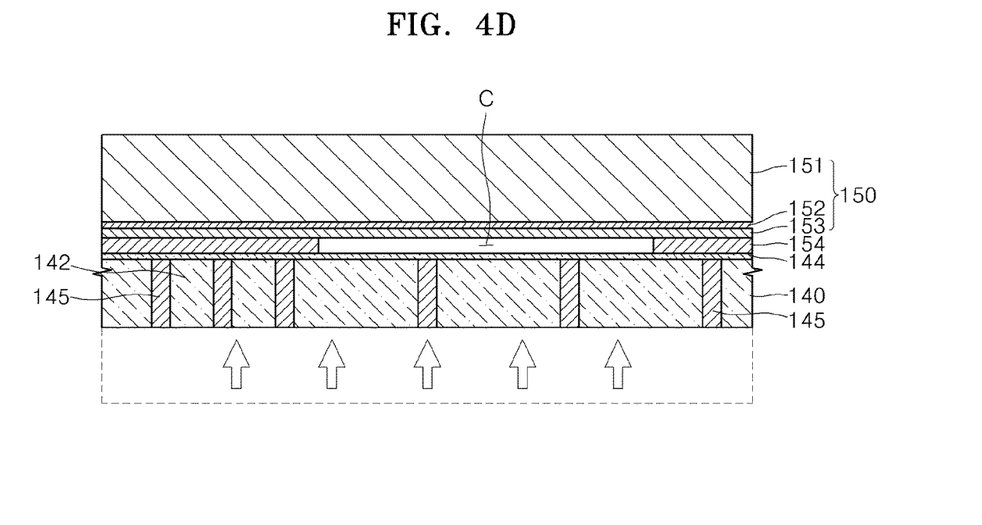

Referring to FIG. 4D, the first wafer 150 is bonded to the device wafer 140a, such that the second insulation layer 154 and the first insulation layer 144 face each other. The device wafer 140a may be formed of low-resistance silicon.

The first wafer 150 and the device wafer 140a may be wafer-to-wafer bonded to each other via a silicon direct bonding (SDB). By bonding the first wafer 150 and the device wafer 140a to each other, the cavity C, which is an empty space, is formed.

The device substrate 140 having a thickness from about 10 μm to about 50 μm is formed by thinning the device wafer 140a. To this end, the device substrate 140 may be first mechanically lapped, and then a CMP process may be performed thereto. By the thinning operation, the insulating material 145 in the first trench T1 and the second trench T2 of the device substrate 140 are exposed.

Figure 4E:
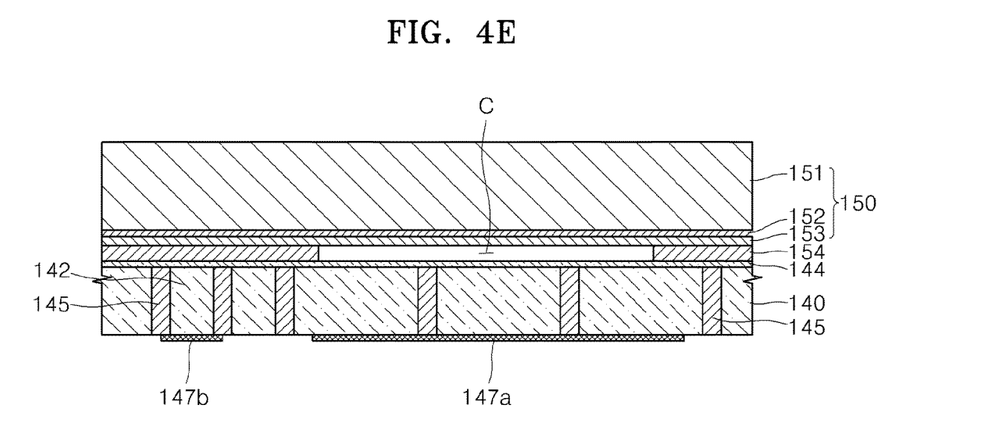

Referring to FIG. 4E, a metal layer is deposited onto the rear surface of the device substrate 140 and the first bonding pad 147a and the second bonding pad 147b are formed by patterning the metal layer. The first bonding pad 147a and the second bonding pad 147b may be formed of materials for eutectic bonding. For example, for Au—Sn eutectic bonding, the first bonding pad 147a and the second bonding pad 147b may be formed of an Au-based material and/or an Sn-based material.

Figure 4F:
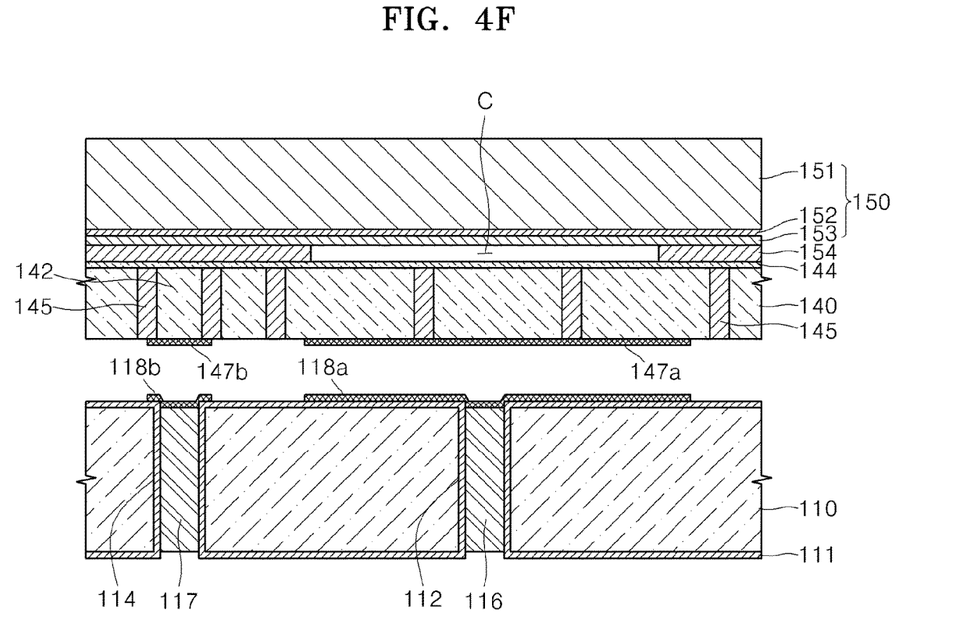

Referring to FIG. 4F, the TSV substrate 110 is prepared. A first through hole 112 and a second through hole 114 are formed in the TSV substrate 110. The first through hole 112 and the second through hole 114 may have widths of about several tens of μm. The first through hole 112 is formed in correspondence to the first portion 141, whereas the second through hole 114 is formed in correspondence to the second portion 142.

A third insulation layer 111 is formed on the TSV substrate 110. The third insulation layer 111 may be formed by oxidizing the TSV substrate 110. The third insulation layer 111 may be formed on surfaces of the first through hole 112 and the second through hole 114 and the top surface and the bottom surface of the TSV substrate 110. The first through hole 112 and the second through hole 114 are filled with metals, thereby forming the first via metal 116 and the second via metal 117.

After forming a metal layer on the TSV substrate 110, the third bonding pad 118a and the fourth bonding pad 118b are formed by patterning the metal layer. The third bonding pad 118a is formed on the first via metal 116 in correspondence to the first bonding pad 147a, whereas the fourth bonding pad 118b is formed on the second via metal 117 in correspondence to the second bonding pad 147b.

The third bonding pad 118a and the fourth bonding pad 118b may be formed of eutectic bonding metals. For example, for Au—Sn eutectic bonding, the third bonding pad 118a and the fourth bonding pad 118b may be formed of an Au-based material and/or a Sn-based material.

Figure 4G:
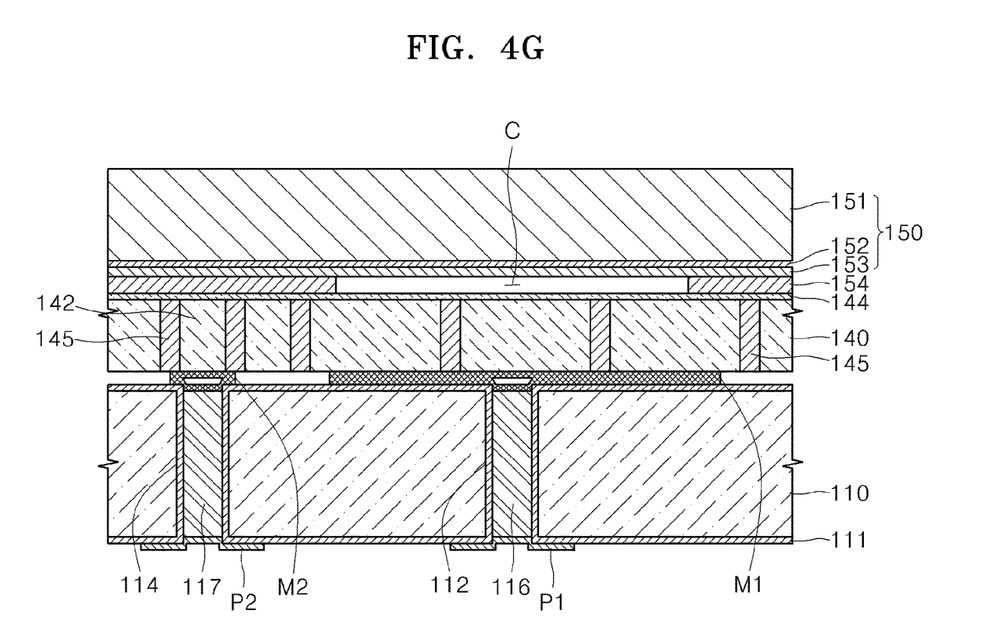

Referring to FIG. 4G, the TSV substrate 110 and the device wafer 140a are bonded to each other at the wafer level. For example, the TSV substrate 110 and the device wafer 140a may be eutectically bonded to each other. The eutectic bonding may be based on Au/Sn bonding. According to an exemplary embodiment, the first bonding pad 147a and the third bonding pad 118a are eutectically bonded to each other and form the first bonding metal M1, whereas the second bonding pad 147b and the fourth bonding pad 118b are eutectically bonded to each other and form the second bonding metal M2.

The first electrode pad P1 connected to the first via metal 116 and the second electrode pad P2 connected to the second bonding metal M2 are formed.

Figure 4H:
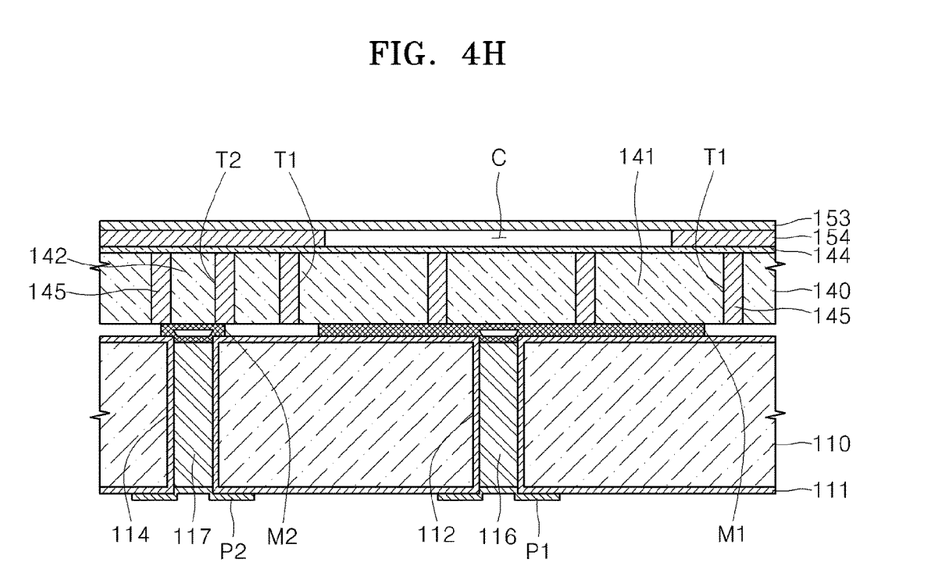

Referring to FIG. 4H, the first silicon layer 151 and the buried oxide layer 152 of the first wafer 150 are sequentially removed. The first silicon layer 151 may be first removed via mechanical lapping, and then the remaining portion of the first silicon layer 151 having a thickness of dozens of μm may be removed via dry etching. The buried oxide layer 152 may be removed via wet etching.

Figure 4I:
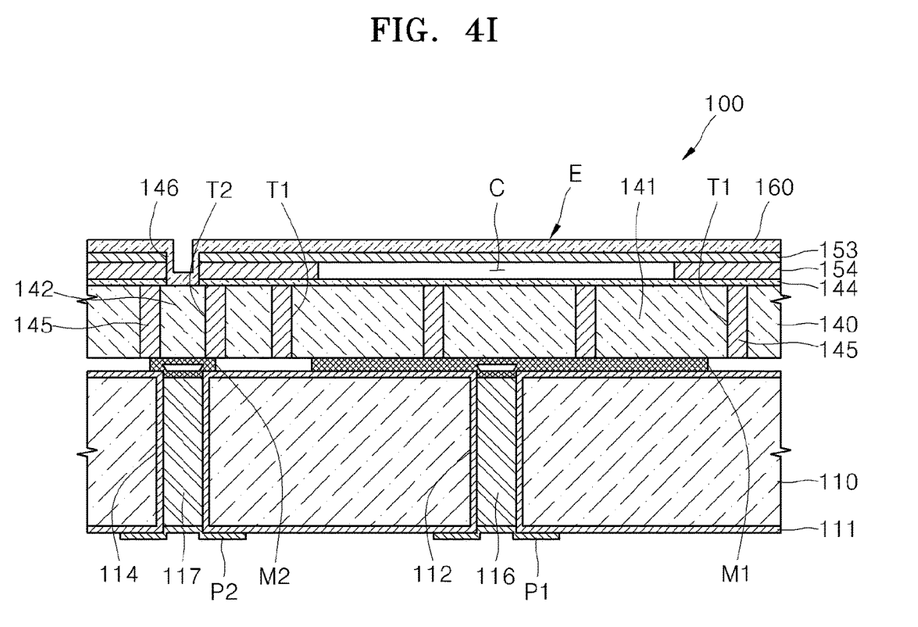

Referring to FIG. 4I, the via hole 146 is formed in the second silicon layer 153, the second insulation layer 154, and the first insulation layer 144 to expose the second portion 142. The top electrode 160 is formed on the second silicon layer 153. The top electrode 160 is formed to be electrically connected to the second portion 142.

The structure fabricated in the operations described above is diced into individual chips, thereby fabricating a plurality of CMUT chips 100.

In the method of fabricating an ultrasonic transducer according to exemplary embodiments, a trench for connecting a top electrode is simultaneously formed with a trench for insulating elements E in a device wafer, and thus, a mask operation for forming a back via, as performed in the related art, is not necessary. Furthermore, short-circuiting between a via metal and a bottom electrode of an element during an operation for forming the back via at a device substrate, which may occur in the related art, may be prevented.

As described above, according to exemplary embodiments, a CMUT according to exemplary embodiments uses a device substrate as an electrode or an electric path, while the electric path is only formed in a vertical direction due to a trench. Therefore, it is easy to block an electric connection between a top electrode and a bottom electrode in a horizontal direction.

Furthermore, there is no trench defining elements, and gaps between elements are reduced, thereby increasing a bandwidth of an ultrasonic transducer.

In the method of fabricating a CMUT according to exemplary embodiments, a trench for connecting a top electrode is simultaneously formed with a trench for insulating elements E in a device wafer, and thus, the overall fabrication process is simplified. Furthermore, short-circuiting between a via metal and a bottom electrode of an element during an operation for forming a back via at a device substrate, which may occur in the related art, may be prevented.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. A method of fabricating a capacitive micromachined ultrasonic transducer (CMUT), the method comprising:
    forming a first trench insulating a plurality of first portions corresponding to an element and a second trench defining a second portion spaced apart from the plurality of first portions, the first trench and the second trench being formed to a predetermined depth from a top surface of a device substrate;
    forming a supporting unit comprising an insulation layer defining a plurality of cavities on the top surface of the device substrate or on a first silicon layer of a silicon-on-insulator (SOI) substrate;
    forming the plurality of cavities between the SOI substrate and the device substrate by bonding the SOI substrate to the top surface of the device substrate;

exposing the first trench and the second trench by thinning a bottom surface of the device substrate;

bonding a through silicon via (TSV) substrate to the bottom surface of the device substrate, the TSV substrate comprising a first via metal connected to the plurality of first portions and a second via metal connected to the second portion;

exposing the first silicon layer on the supporting unit by removing a buried oxide layer and a second silicon layer of the SOI substrate;

exposing the second portion by forming a via hole penetrating through the first silicon layer and the supporting unit; and forming a top electrode on the first silicon layer to contact the second portion through the via hole.

2. The method of claim 1, wherein the device substrate comprises a low-resistance silicon.

3. The method of claim 1, wherein the device substrate is bonded to the SOI substrate using a silicon direct bonding method.

4. The method of claim 1, wherein the forming of the first trench and the second trench comprises forming the first trench and the second trench to have a same width.

5. The method of claim 4, wherein the width of the first trench and the second trench is from about 1 μm to about 10 μm.

6. The method of claim 1, wherein the forming of the first trench and the second trench comprises forming the first trench and the second trench to have a depth from about 10 μm to about 50 μm.

7. The method of claim 1, further comprising filling the first trench and the second trench with an insulating material.

8. The method of claim 1, wherein the bonding of the TSV substrate to the bottom surface of the device substrate comprises:

forming a first bonding pad contacting the plurality of first portions and a second bonding pad contacting the second portion on the bottom surface of the device substrate;

forming a third bonding pad on the first via metal of the TSV substrate and a fourth bonding pad on the second via metal of the TSV substrate;

forming the first bonding pad and the second bonding pad to respectively contact the third bonding pad and the fourth bonding pad; and performing eutectic bonding the first bonding pad and the third bonding pad, and the second bonding pad and the fourth bonding pad.

\* \* \* \* \*